United States Patent
Reial et al.

(10) Patent No.: US 8,103,219 B2
(45) Date of Patent: Jan. 24, 2012

(54) METHOD AND APPARATUS FOR FREQUENCY CONTROL IN WIRELESS COMMUNICATIONS

(75) Inventors: Andres Reial, Malmö (SE); Bo Bernhardsson, Lund (SE); Xiaohui Wang, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 499 days.

(21) Appl. No.: 12/337,964

(22) Filed: Dec. 18, 2008

(65) Prior Publication Data

US 2010/0159862 A1 Jun. 24, 2010

(51) Int. Cl.
*H04B 17/00* (2006.01)
(52) U.S. Cl. .............................. 455/67.16; 455/63.1
(58) Field of Classification Search ............... 455/67.16, 455/67.13, 63.1, 62; 375/344
See application file for complete search history.

(56) References Cited

U.S. PATENT DOCUMENTS

| | | | |
|---|---|---|---|
| 5,748,682 A | | 5/1998 | Mobin |
| 5,812,615 A | * | 9/1998 | Baum et al. .................. 375/344 |
| 5,889,759 A | | 3/1999 | McGibney |
| 6,463,266 B1 | | 10/2002 | Shohara |
| 6,704,552 B1 | | 3/2004 | Matsumoto |
| 7,003,415 B2 | | 2/2006 | Jitsukawa et al. |
| 7,330,523 B2 | | 2/2008 | Young |
| 7,386,067 B2 | | 6/2008 | Kobayashi et al. |
| 7,620,125 B1 | * | 11/2009 | Chang et al. .................. 375/326 |
| 7,809,490 B2 | * | 10/2010 | Liu et al. ...................... 701/103 |
| 2003/0048860 A1 | * | 3/2003 | Schweickert et al. ........ 375/340 |
| 2004/0058653 A1 | | 3/2004 | Dent |
| 2004/0176148 A1 | * | 9/2004 | Morimoto ..................... 455/574 |
| 2007/0041432 A1 | | 2/2007 | Reial |
| 2007/0104298 A1 | * | 5/2007 | Filipovic et al. ............. 375/344 |

FOREIGN PATENT DOCUMENTS

| | | |
|---|---|---|
| EP | 1480369 A1 | 11/2004 |
| WO | WO03069865 A1 | 8/2003 |

OTHER PUBLICATIONS

"International Search Report." Application No. PCT/EP2009/066752. Date of mailing: Mar. 26, 2010. European Patent Office, Rijswijk, Netherlands.

* cited by examiner

*Primary Examiner* — Peguy Jean Pierre
(74) *Attorney, Agent, or Firm* — Coats & Bennett, P.L.L.C.

(57) ABSTRACT

The automatic frequency correction value applied by a receiver is altered to minimize long-term drift of a path delay profile. In one embodiment, the phase or timing error resulting from constant frequency corrections is accumulated, and an estimated frequency correction value is selectively quantized into an actual frequency correction value in response to the accumulated phase/timing error. The quantized value above or below the estimate is selected to minimize the accumulated phase/timing error that gives rise to path delay profile drift. In another embodiment, a timing circuit measures the instantaneous path delay profile drift incurred with each frequency correction, and integrates the instantaneous drift measurements over time to yield a path delay profile drift. The drift (or its rate of change) is then used to adjust a frequency correction value so as to minimize the drift.

17 Claims, 8 Drawing Sheets

METHOD AND APPARATUS FOR FREQUENCY CONTROL IN WIRELESS COMMUNICATIONS

TECHNICAL FIELD

The present invention relates generally to wireless communications, and in particular to systems and methods of receiver frequency control.

BACKGROUND

In wireless communications, digital data is transmitted over the air via analog waveforms. The binary information is mapped into complex-valued modulated symbols representing one or more bits, transmitter (TX) pulse shaping filtering is applied, and the signal is up-converted to radio frequency (RF). At a receiver—also referred to in the art as user equipment—the signal is down-converted, receiver (RX) filtered, sampled, and demodulated. In the absence of channel impairments and if the sampling instant is chosen properly, the data may be recovered perfectly.

In practical systems, the timing of the TX and RX chains is not firmly synchronized, whereby the proper sampling instant is not known in advance. Rather, it depends on the transmission conditions, such as the propagation and processing delays. In addition, the radio channel and the receiver circuitry add noise and interference to the received signal, whereby the Signal to Interference and Noise Ratio (SINR) is degraded. In order to recover the signal with the highest quality possible, the choice of the sampling instant is important.

In order to provide the best sampling instant in a stable and robust manner, the RX clocking reference is typically locked to the TX frequency, as observed at the receiver, in a process known as Automatic Frequency Control (AFC). In addition, the phase of the sampling clock may be adjusted so as to provide the optimal sampling instant. Receiver frequency and time synchronization are well known in the art.

In typical implementations, the frequency and timing correction measures are applied to solve their respective tasks in a disjoint manner. The AFC is used to remove as much of the frequency offset as possible, by tuning the frequency reference or applying de-rotation. The usual criterion is to minimize the magnitude or mean squared error (MSE) of the residual frequency error after the correction.

Modern wireless broadband systems, such as HSPA Evolved in 3GPP, require high effective receiver SINR values, e.g., over 25 dB, to successfully receive data at the peak system rates. This requires very precise estimation and correction of timing errors, on the order of $\frac{1}{64}$-th of a chip (4 ns) in HSDPA. Regardless of the methods used to estimate and correct the errors, practical estimation with sufficient quality requires the underlying process to be relatively stable over an extended period.

To minimize timing errors, and to track multipath signal components over time for calculating generalized RAKE (G-RAKE) finger placement delays, the relative temporal offsets of received multipath signal components are tracked in a path delay profile. In practice, this tracking is typically necessary even when the terminal is not physically moving, since the observed delay profile still drifts. When the path delay profile drifts over time, the positions of the RAKE or G-RAKE fingers (or channel equalization filter taps) must be updated in order to avoid losing signal energy, which implies shifting their positions. This means that, for example, the parameter filtering processes associated with the RAKE fingers must be reset or re-initialized to account for the new positions, and possible inter-finger distances. This causes additional computational load in the finger management circuitry, reducing the performance of the reception algorithms, as well as increasing power consumption.

SUMMARY

According to one or more embodiments of the present invention, the frequency correction value applied to a received signal by an automatic frequency control unit is altered so as to minimize long-term drift of a path delay profile. In one embodiment, the phase error resulting from constant frequency corrections is accumulated, and is a decision variable in a selective quantization of an estimated frequency correction value into an actual frequency correction value. In particular, if the accumulated phase error is positive, the quantized actual frequency correction value below the estimated frequency correction value is selected; if the accumulated phase error is negative, the quantized value above the estimated value is selected. The selected actual value is then applied in the frequency correction, to minimize the accumulated residual phase error, i.e. after the automatic frequency control unit that gives rise to path delay profile drift. In another embodiment, a timing circuit measures the instantaneous path delay profile drift incurred with each frequency correction, and integrates the instantaneous drift measurements over time to yield a path delay profile drift. The drift (or its rate of change) is then used as the decision variable to adjust a frequency correction value so as to minimize the drift.

One embodiment relates to a method of reducing path delay profile drift in a wireless communication receiver implementing automatic frequency correction. An accumulated timing or phase offset is estimated in a received signal. A target frequency correction value is determined, the target frequency correction value is quantized into an actual frequency correction value in response to the accumulated phase offset and the actual frequency correction value is applied to the received signal in a frequency correction operation. The applied frequency error correction value may thus be forced to be higher or lower than the target frequency error correction value so as to minimize the accumulated timing or phase offset.

Another embodiment relates to a wireless communication receiver. The receiver includes an automatic frequency control (AFC) unit operative to determine a target frequency correction value. The AFC unit includes a frequency error accumulation unit operative to estimate an accumulated timing or phase offset in a received signal and a frequency correction quantization unit operative to quantize the target frequency correction value into an actual frequency correction value in response to the accumulated timing or phase offset. The AFC unit is further operative to apply the actual frequency correction value to the received signal so as to minimize drift over time in a path delay profile caused by a constant frequency correction.

Another embodiment relates to a wireless communication user equipment which includes one or more antennas and the wireless communication receiver.

DETAILED DESCRIPTION

Figure 1:
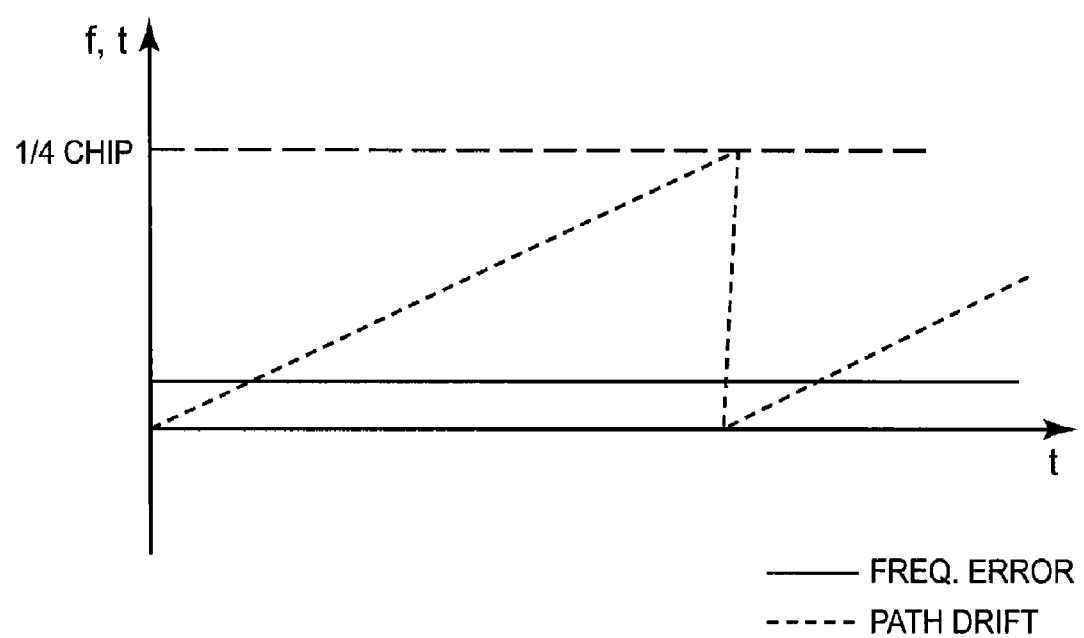
FIG. 1 is a graph depicting the prior art relationship between frequency error and path delay profile drift.

The path drift in static conditions, described earlier, is typically encountered in prior art AFC systems. The problem arises from the fact that that using the minimum error magnitude or mean square error (MSE) criterion to minimize the frequency error in the AFC may result in a constant (or near-constant) residual frequency error over some duration. This is due to TX and RX clock rate difference maintaining a constant sign over time, such as may occur when the receiver is in a static position with respect to the transmitter, and the AFC maintains a constant frequency setting. Even a small constant frequency error allows the accumulated phase error, which is the integral of the frequency error over time, to grow without bound. This is depicted in FIG. 1, where the path timing offset drifts all the way to the maximum possible value, before being wrapped around as a result of a de-spreader position change. The accumulated phase error gives rise to a long-term drift of the observed path delay profile.

Conventional AFC systems attempt to minimize the residual frequency error (that is, the error remaining after applying frequency correction). If the estimated pre-correction error is $f_{est}$, ideally the correction actually applied, $f_{corr}$, would be $f_{corr}=f_{est}$. However, in practice, the set of the available correction values is limited due to a limited precision of the variable used to control the local oscillator. The actual correction will thus be some quantized version of the estimated error:

$$f_{corr}=Q(f_{est}).$$

The appropriate quantization may be determined in several ways. For example, it may be chosen so as to minimize the absolute error:

$$f^*_{corr}=\arg\min |f_{est}-f_{corr}|.$$

Alternatively, a ceiling or floor operation may be used, for example for the floor operation:

$$f^*_{corr}=\lfloor f_{est}\rfloor.$$

Regardless of the quantization selected, if the propagation conditions and the receiver state remain constant, a steady-state situation may occur where the same correction vales, and more importantly, the same residual error $f_{est}-f_{corr}$ is maintained over an extended period. This allows the accumulated phase error to increase dramatically, as depicted by the dashed curve in FIG. 1.

Figure 2:
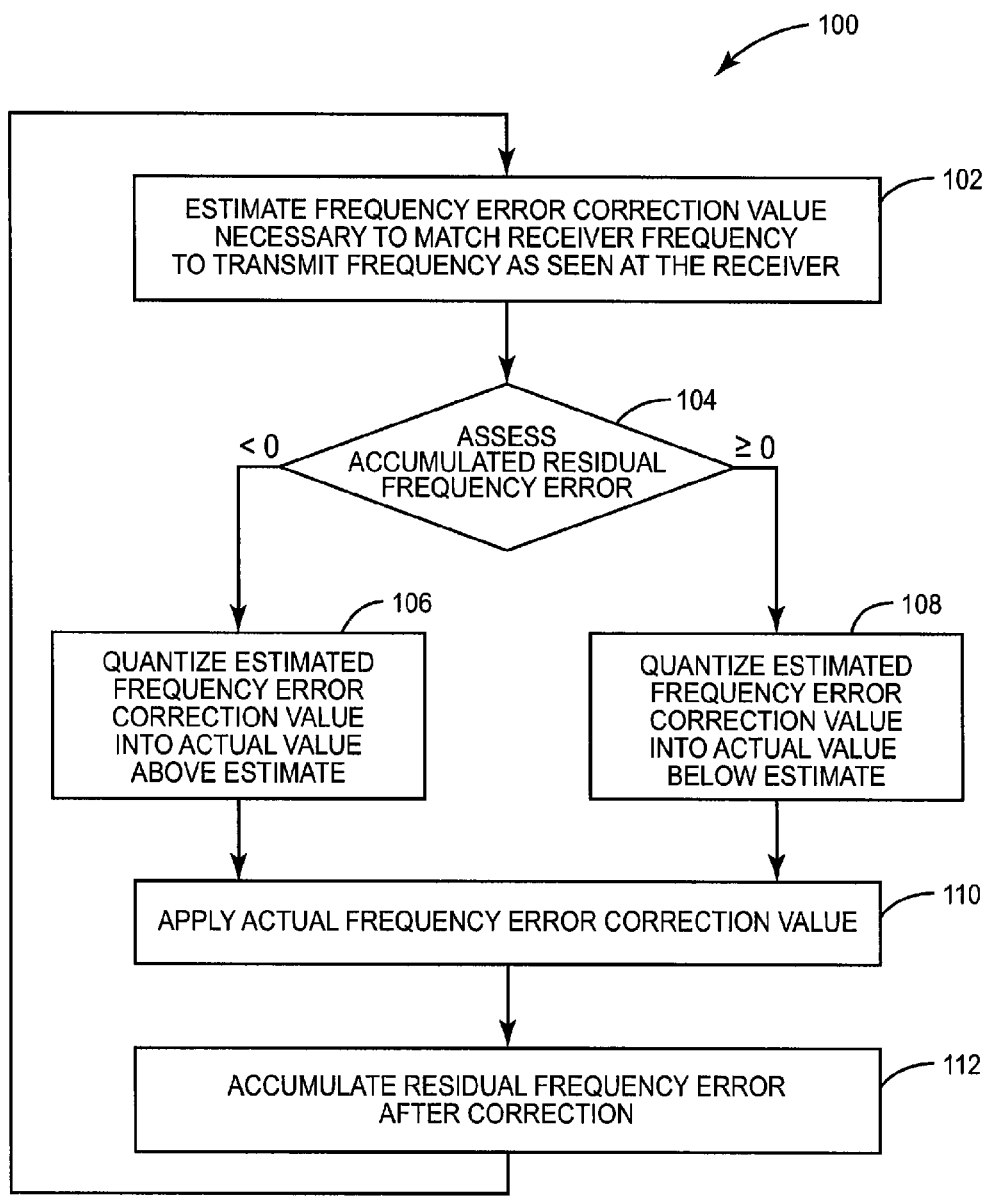
FIG. 2 is a flow diagram of a method of reducing path delay profile drift in a wireless communication receiver implementing frequency correction.

According to embodiments of the present invention, rather than repeatedly applying the same quantization to the frequency correction $f_{est}$, the knowledge of the quantization error is exploited to minimize the accumulated phase gain over time. FIG. 2 depicts a method 100 of achieving this. The ideal, desired frequency error correction value $f_{est}$ is estimated (block 102). Applying this value would result in zero residual frequency error, but the exact value may typically not be applied due to the quantization constraints described above. The accumulated residual frequency error over time $F_{acc}$ is then assessed (block 104). This may be done e.g. by integrating (summing) the residual frequency error $f_{est}-f_{corr}$ of all past AFC correction instances. Based on the sign of $F_{acc}$, the estimated frequency error correction value $f_{est}$ is quantized into an actual frequency error correction value $f_{corr}$ above $f_{est}$, if $F_{acc}<0$ (block 106), or below $f_{est}$, if $F_{acc} \geq 0$ (block 108). That is, the following rule is applied to derive the actual frequency error correction value applied to the received signal:

$$f_{corr} = \begin{cases} Q^+(f_{est}) & \text{if } F_{acc} < 0 \\ Q^-(f_{est}) & \text{if } F_{acc} \geq 0 \end{cases} \quad (1)$$

where $Q^+(f_{est})$ and $Q^-(f_{est})$ are the closest available quantized frequency error correction values above and below the estimated frequency error correction value, respectively.

The decision variable $F_{acc}$ is the accumulated residual frequency error at time t, describing the total phase deviation over time:

$$F^t_{acc} = \sum_{k=0}^{t-1} (f^k_{est} - f^k_{corr}), \quad (2)$$

or $$F^t_{acc} = F^{t-1}_{acc} + f^k_{est} - f^k_{corr}.$$

$F^t_{acc}$ is typically set to 0 at t=0. The actual frequency error correction value $f_{corr}$ is then applied to the received signal (block 110), and the frequency error after correction is added to the accumulated residual frequency error $F_{acc}$ (block 112). The method 100 then repeats with the next AFC correction cycle.

Figure 3:
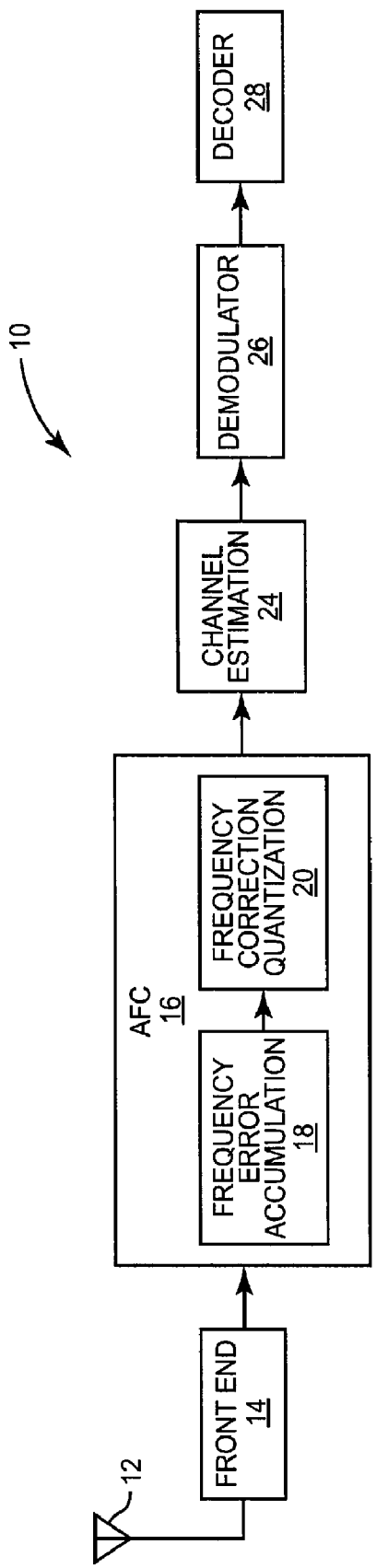
FIG. 3 is a functional block diagram of a receiver using automatic frequency correction to reduce path delay profile drift according to one embodiment of the present invention.

The relevant portion of a receiver 10, according to one embodiment, is depicted in FIG. 3. A wireless communication signal is received at antenna(s) 12 associated with the receiver, and processed (including low-noise amplification, filtering, ADC, and the like) in front-end processing module 14. An AFC unit 16 periodically adjusts the frequency of the received signal to match the receiver frequency to the transmit frequency, as seen at the receiver. A channel estimation unit 24 generates channel estimates based on reference, or pilot, symbols in the received communication signal. Based on the channel estimates, the demodulator 26 recovers symbols, and the decoder 28 recovers digital data, from the received signal.

Within the AFC unit 16, a residual frequency error accumulation unit 18 generates the accumulated residual frequency error $F_{acc}$, e.g., by applying equation (2) to the residual frequency error estimated within the AFC unit 16. A frequency correction quantization unit 20 selectively quantizes an estimated frequency error correction value $f_{est}$ into an actual frequency error correction value $f_{corr}$ so as to minimize $F_{acc}$, e.g., by applying equation (1) to $f_{est}$.

In one embodiment, for situations when a larger profile deviation may be tolerated, the delay profile drift does not need to be corrected every frequency error correction update. In this embodiment, the phase error is allowed to accumulate for a predetermined number of frequency correction cycles, or to a predetermined accumulated phase error amount, before revising the frequency error correction direction. Thus, the update of $F_{acc}$ and/or the AFC decision may not need to be done at each frequency error correction update. Additionally or alternatively, filtering may be applied to $F_{acc}$ to improve robustness.

Figure 4:
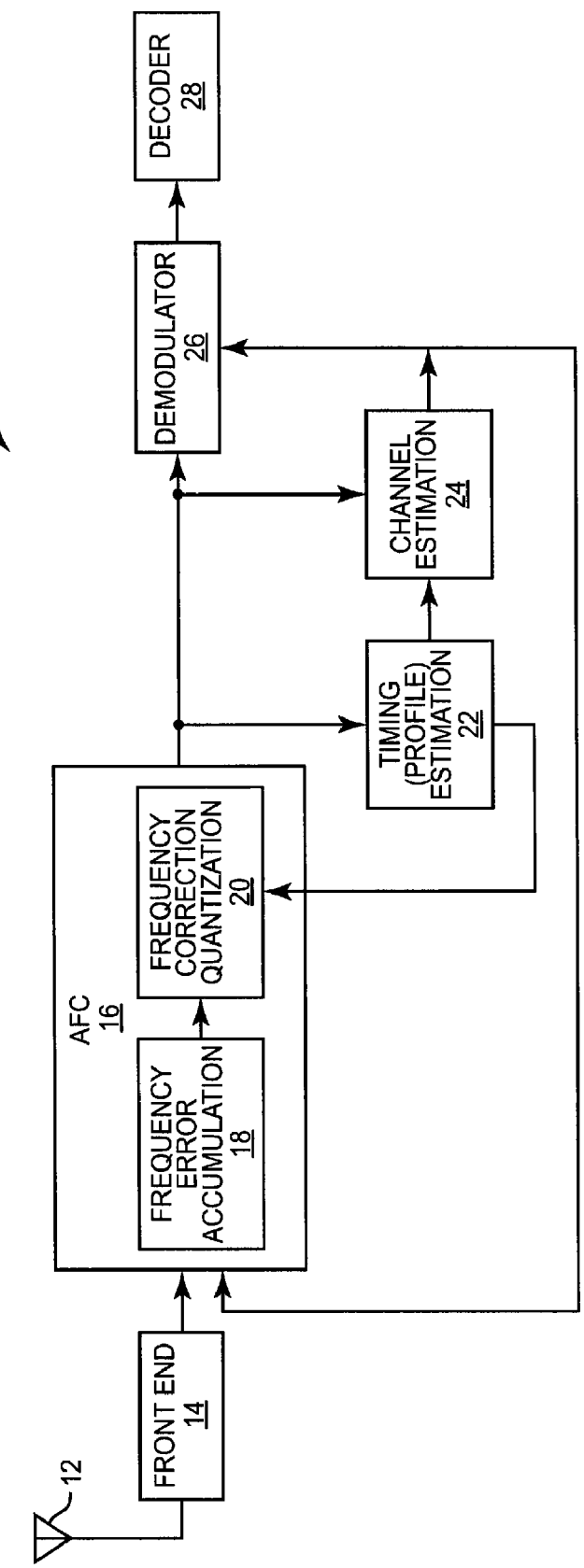
FIG. 4 is a functional block diagram of a receiver using a timing estimator and path delay profile drift feedback to reduce the drift according to one embodiment of the present invention.

In one embodiment, depicted in FIG. 4, the current path delay profile deviation from some desired position (e.g. zero sampling offset) is estimated in a timing estimation unit 22, and supplied to the AFC 16. The direction of the profile drift as a function of the accumulated phase error is known by receiver design. For example, assume that the positive accumulated error yields a positive profile drift $\Delta d$. Then the accumulated phase error value would be constructed as:

$$F_{acc} = \begin{cases} +1, & \Delta d \geq 0 \\ -1 & \Delta d < 0 \end{cases}$$

and (1) would be applied.

Figure 5:
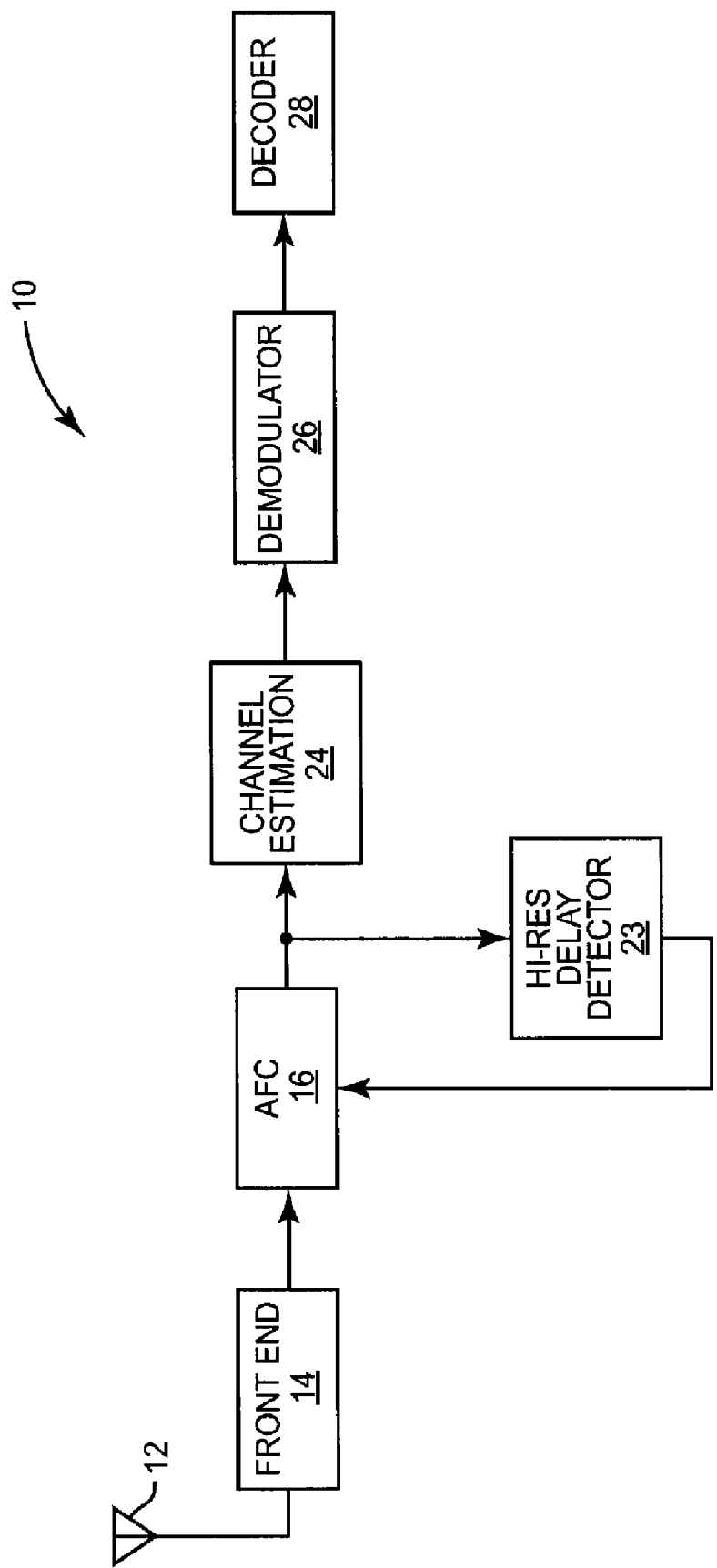
FIG. 5 is a functional block diagram of a receiver using a high resolution delay detector to detect path delay profile drift according to one embodiment of the present invention.
Figure 7:
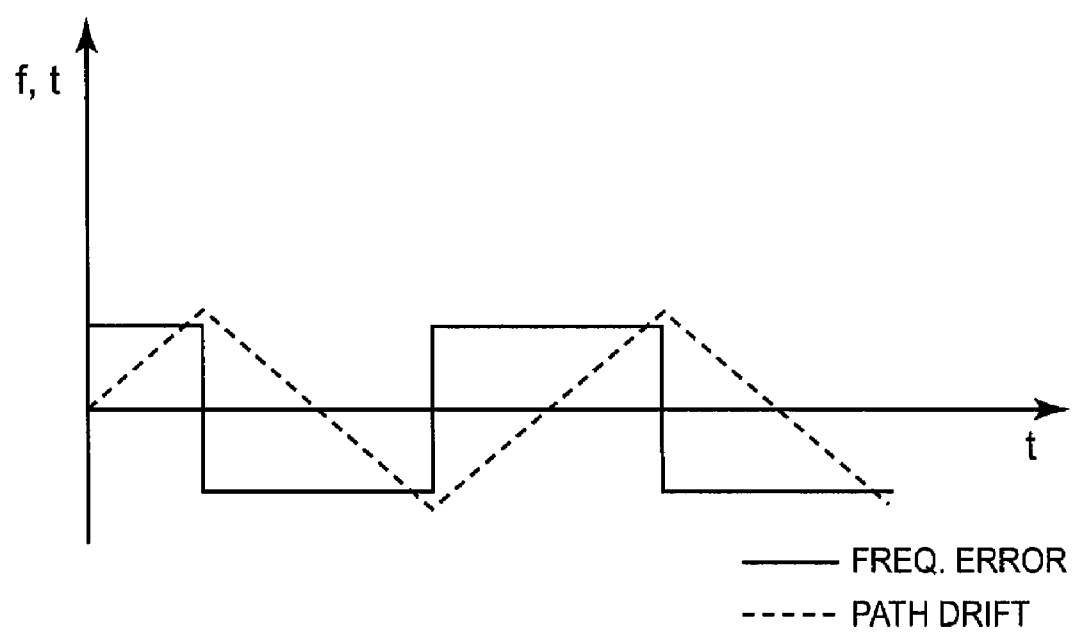
FIG. 7 is a graph depicting the relationship between frequency error correction and path delay profile drift according to embodiments of the present invention.

In one embodiment, depicted in FIG. 5, a high resolution delay detector 23 determines the path drift directly. If the path drift has been found to be on one side of the desired delay, the frequency correction is changed to its closest neighbor with the corresponding sign. The path drift is now in the opposite direction, as shown in FIG. 7, until it reaches the finest resolution point of the delay detector 23 on the other side of the desired delay, then the frequency correction will be set to its closest neighbor with the opposite sign, i.e. the original frequency correction value if no update to the frequency correction has been made during this period of time.

Figure 6:
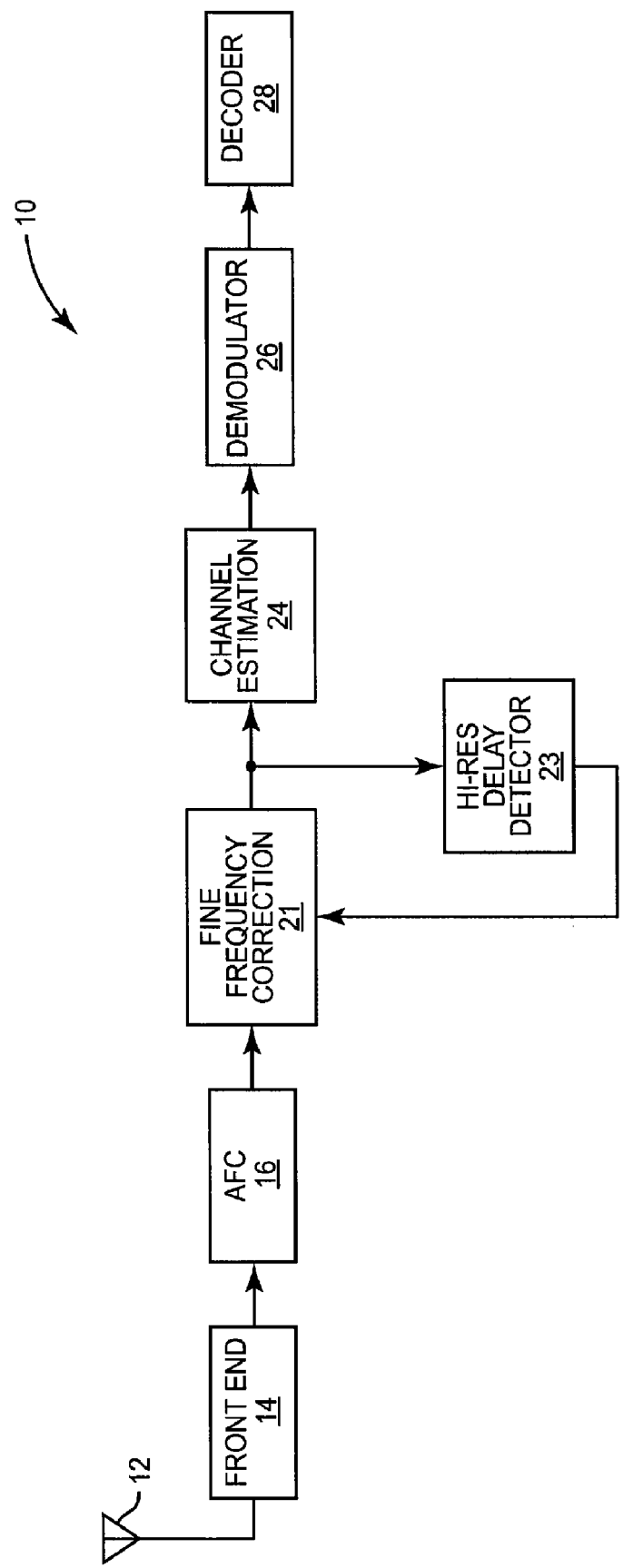
FIG. 6 is a functional block diagram of a receiver using a high resolution delay detector and a fine frequency correction unit to minimize path delay profile drift according to one embodiment of the present invention.

In one embodiment, depicted in FIG. 6, a fine frequency correction unit 21 with finer resolution and a few correction levels, such as a phase rotator, is employed in addition to the main frequency correction unit 16. If a path delay profile drift is detected at the finest resolution point of the high resolution delay detector 23 on one side of the desired delay, the fine frequency correction unit 21 will set the frequency correction with a first correction level and the corresponding sign. If the path delay profile drift is now in the opposite direction, as depicted in FIG. 7, nothing will be done until it reaches the finest resolution point of the high resolution delay detector 23 on the other side of the desired delay. At that point, the fine frequency correction unit 21 will set the frequency correction with the first correction level and the opposite sign.

On the other hand, if the path delay profile drift is determined to be in the same direction even after setting the frequency correction with the first correction level, the fine frequency correction unit 21 will then set the frequency correction with the next correction level and the same sign. This process can be extended to many correction levels, forcing the path delay profile to oscillate around the desired delay, yet without adding high frequency biases. However, too many correction levels will mean larger path delay profile drifts and/or higher resolutions of the high resolution delay detector 23, which should be avoided. Those of skill in the art can readily make and implement the design tradeoffs to achieve an optimal solution for any given implementation, given the teachings of the present disclosure.

Figure 8:
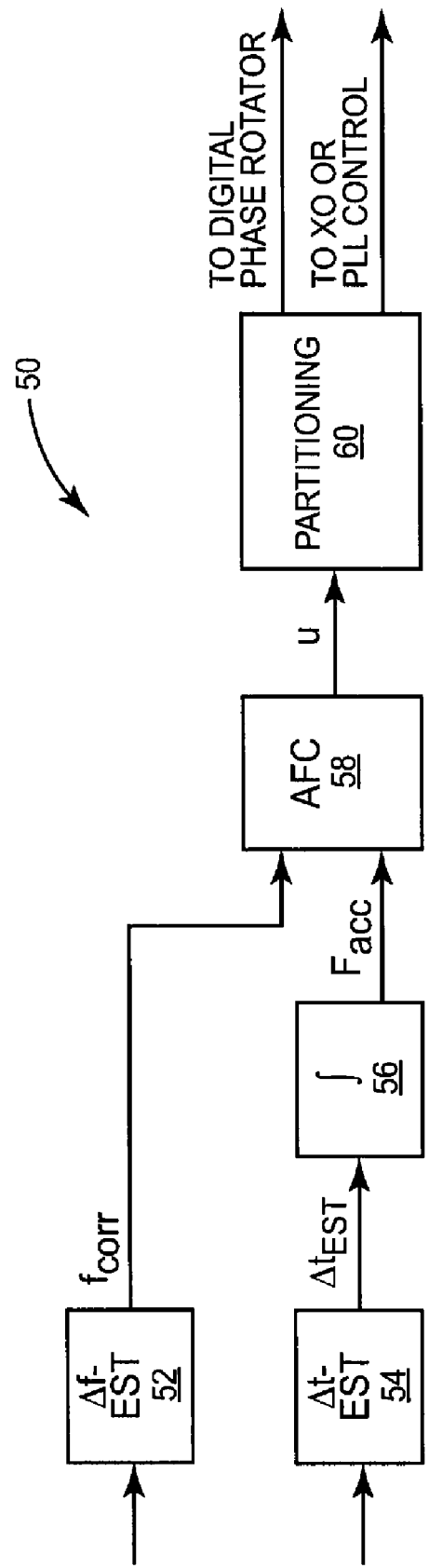
FIG. 8 is a functional block diagram of a receiver estimating and integrating instantaneous path delay profile drift to reduce the drift according to one embodiment of the present invention.

FIG. 8 depicts an embodiment employing a more general control loop approach to eliminating path delay profile drift in the relevant portion 50 of a receiver. A frequency estimation unit 52 is a conventional frequency error estimator, providing a frequency error correction value $f_{corr}$ to the AFC frequency correction block 58. Note that this value is quantized from an estimated frequency error correction value $f_{est}$ using the prior art "closest approximation" approach, and may be a constant value, giving rise to an increasing residual phase error accumulation. A timing estimator unit 54 estimates the instantaneous drift in the path delay profile, $\Delta t_{est}$, caused by a prior frequency correction. An integrator 56 integrates the instantaneous drift in the path delay profile, yielding $F_{acc}$, the accumulated profile drift over time. The total drift value (and/or its rate of change) is then used to control the desired frequency correction u signaled at the output of the AFC unit 58. In this embodiment, the desired effect of controlling the direction of the path delay profile drift is achieved by modifying the target frequency correction, rather than adjusting the quantization of an estimated frequency error correction value, as in equation (1). A partitioning unit 60 may then implement the frequency correction by adjusting a phase rotator, or controlling a frequency source such as a crystal oscillator or a phase locked loop.

Path delay profile drift elimination, according to one or more embodiments of the present invention, improves receiver performance at high signal-to-interference-and-noise ratio (SINR) values by allowing more precise avoidance, estimation, and/or correction of the sampling error. Additionally, embodiments of the present invention reduce the receiver control tasks by minimizing the need for RAKE/G-RAKE finger re-positioning and improve performance by avoiding unnecessary filtering re-initializations. Avoiding these tasks frees up computational resources and reduces power consumption.

FIGS. 3, 4, 5, 6, and 8 are functional block diagrams meant to explain aspects of embodiments of the present invention, and do not necessarily correspond to actual circuits or software modules. In general, any or all of the functions of AFC 16, 58, frequency error accumulation 18, frequency correction quantization 20, fine frequency correction 21, timing/profile estimation 22, high-resolution delay detection 23, channel estimation 24, demodulator 26, decoder 28, frequency error estimation 52, timing/profile error estimation 54, integrator 56, and partitioning 60 may be implemented as dedicated hardware circuits, programmable or configurable logic circuits with appropriate firmware, or software modules executing on a controller such as a Digital Signal Processor (DSP). Furthermore, functionality represented by the above functional blocks may be combined or separated beyond the blocks depicted. All depicted and described embodiments are representative only, and not limiting.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of reducing path delay profile drift in a wireless communication receiver implementing frequency correction, comprising:
    estimating an accumulated timing or phase offset in a received signal;
    determining a target frequency correction value;
    quantizing the target frequency correction value into an actual frequency correction value in response to the accumulated timing or phase offset; and applying the actual frequency correction value to the received signal in a frequency correction operation.

2. The method of claim 1 wherein the accumulated timing or phase offset is estimated from residual frequency errors.

3. The method of claim 1 wherein the accumulated phase offset is estimated from the timing offset.

4. The method of claim 1 wherein quantizing the target frequency correction value into an actual frequency correction value in response to the accumulated phase offset comprises selecting the actual frequency correction value according to $$f_{corr} = \begin{cases} Q^+(f_{est}) & \text{if } F_{acc} < 0 \\ Q^-(f_{est}) & \text{if } F_{acc} \geq 0, \end{cases}$$

where
$f_{est}$ is the target frequency correction value;
$f_{corr}$ is the actual frequency correction value;
$Q^+(f_{est})$ and $Q^-(f_{est})$ are the closest available quantized values above and below the target frequency correction value, respectively; and
$F_{acc}$ is the accumulated residual frequency error at time t, describing the total phase deviation over time.

5. The method of claim 4, where $F_{acc}$ is calculated according to $$f_{acc}^t = \sum_{k=0}^{t-1} (f_{est}^k - f_{corr}^k),$$

where
t is time; and
$F^t_{acc}$ is set to 0 at t=0.

6. The method of claim 1, wherein determining a target frequency correction value comprises
estimating an instantaneous drift in a path delay profile of a received signal, caused by a prior frequency correction;
integrating the instantaneous drift in the path delay profile to obtain an accumulated profile drift over time; and
adjusting an estimated frequency correction value to reduce the accumulated profile drift.

7. The method of claim 6, wherein adjusting an estimated frequency correction value to reduce the accumulated profile drift comprises adjusting the estimated frequency correction value based on the rate of change of the accumulated profile drift.

8. A wireless communication receiver, comprising:
an automatic frequency control (AFC) unit operative to determine a target frequency correction value, the AFC unit comprising
a frequency error accumulation unit operative to estimate an accumulated timing or phase offset in a received signal; and
a frequency correction quantization unit operative to quantize the target frequency correction value into an actual frequency correction value in response to the accumulated timing or phase offset;
wherein the AFC unit is further operative to apply the actual frequency correction value to the received signal.

9. The receiver of claim 8 further comprising a timing estimation unit operative to estimate the deviation from a predetermined position of a path delay profile of a received signal.

10. The receiver of claim 8 further comprising a high resolution delay detector unit operative to determine a path drift of a path delay profile of a received signal, and wherein the AFC unit is operative to adjust the actual frequency correction value in response to the path drift.

11. The receiver of claim 10 further comprising a fine frequency correction unit operative to adjust the frequency of a post-AFC unit signal in response to the path drift provided by the high resolution delay detector unit.

12. A wireless communication receiver, comprising:
a frequency estimation unit operative to generate a target frequency error correction value for a received signal;
a timing estimator unit operative to estimate an instantaneous drift in a path delay profile of the received signal caused by a prior frequency correction;
an integrator operative to integrate the instantaneous drift in the path delay profile to generate the accumulated profile drift over time; and
an automatic frequency control (AFC) unit receiving the target frequency error correction value and an accumulated profile drift and outputting an actual frequency error correction value, and operative to modify the target frequency correction value by a factor selected from the group consisting of the accumulated profile drift and a rate of change of the accumulated profile drift.

13. The receiver of claim 12 further comprising a partitioning unit operative to implement the actual frequency correction by generating one or more control signals to one or more frequency sources.

14. A wireless communication user equipment, comprising:
one or more antennas operative to receive a communication signal; and
a receiver comprising
an automatic frequency control (AFC) unit operative to determine a target frequency correction value for the received signal, the AFC unit including
a frequency error accumulation unit operative to estimate an accumulated timing or phase offset in the received signal; and
a frequency correction quantization unit operative to quantize the target frequency correction value into an actual frequency correction value in response to the accumulated timing or phase offset;
wherein the AFC unit is further operative to apply the actual frequency correction value to the received signal.

15. The wireless communication user equipment of claim 14 further comprising a timing estimation unit operative to estimate the deviation from a predetermined position of a path delay profile of a received signal.

16. The wireless communication user equipment of claim 14 further comprising a high resolution delay detector unit operative to determine the path drift of a path delay profile of a received signal, and wherein the AFC unit is operative to adjust the actual frequency correction value in response to the path drift.

17. The wireless communication user equipment of claim 16 further comprising a fine frequency correction unit operative to adjust the frequency of a post-AFC unit signal in response to the path drift provided by the high resolution delay detector unit.

* * * * *

UNITED STATES PATENT AND TRADEMARK OFFICE
CERTIFICATE OF CORRECTION

PATENT NO.       : 8,103,219 B2                                                Page 1 of 1
APPLICATION NO.  : 12/337964
DATED            : January 24, 2012
INVENTOR(S)      : Reial et al.

It is certified that error appears in the above-identified patent and that said Letters Patent is hereby corrected as shown below:

In Column 7, Line 30, in Claim 5, delete "$f^t_{acc}$" and insert -- $F^t_{acc}$ --, therefor.

Signed and Sealed this
Nineteenth Day of June, 2012

David J. Kappos
*Director of the United States Patent and Trademark Office*